(12) United States Patent
Prejbeanu et al.

(10) Patent No.: US 8,102,701 B2
(45) Date of Patent: Jan. 24, 2012

(54) MAGNETIC MEMORY WITH A THERMALLY ASSISTED WRITING PROCEDURE

(75) Inventors: Ioan Lucian Prejbeanu, Sassenage (FR); Jean-Pierre Nozieres, Le Sappey en Chartreuse (FR)

(73) Assignee: Crocus Technology SA, Grenoble Cedex (FR)

( * ) Notice: Subject to any disclaimer, the term of this patent is extended or adjusted under 35 U.S.C. 154(b) by 0 days.

(21) Appl. No.: 12/813,549

(22) Filed: Jun. 11, 2010

(65) Prior Publication Data
US 2010/0246254 A1 Sep. 30, 2010

Related U.S. Application Data

(63) Continuation of application No. PCT/EP2008/065198, filed on Nov. 10, 2008.

(30) Foreign Application Priority Data

Dec. 13, 2007 (EP) ..................................... 07291520

(51) Int. Cl.
*G11C 11/00* (2006.01)
(52) U.S. Cl. .... 365/158; 365/171; 365/173; 365/189.16
(58) Field of Classification Search .................. 365/158, 365/171, 173, 189.16
See application file for complete search history.

(56) References Cited

U.S. PATENT DOCUMENTS

| 4,949,039 | A | 8/1990 | Grunberg |
| 5,159,513 | A | 10/1992 | Dieny et al. |
| 5,343,422 | A | 8/1994 | Kung et al. |
| 5,583,725 | A | 12/1996 | Coffey et al. |
| 5,640,343 | A | 6/1997 | Gallagher et al. |
| 6,532,164 | B2 | 3/2003 | Redon et al. |
| 6,603,677 | B2 | 8/2003 | Redon et al. |
| 7,276,384 | B2 * | 10/2007 | Parkin et al. ...................... 438/3 |
| 7,898,833 | B2 * | 3/2011 | Prejbeanu et al. ............... 365/50 |
| 2005/0002228 | A1 | 1/2005 | Dieny et al. |
| 2005/0104101 | A1 | 5/2005 | Sun et al. |
| 2005/0110004 | A1 * | 5/2005 | Parkin et al. .................... 257/30 |
| 2005/0180202 | A1 | 8/2005 | Huai et al. |
| 2009/0147392 | A1 * | 6/2009 | Prejbeanu et al. ............... 360/59 |

FOREIGN PATENT DOCUMENTS
FR  2829867 A1  3/2003

OTHER PUBLICATIONS

International Search Report for PCT/EP2008/065198 dated Mar. 13, 2009.

* cited by examiner

*Primary Examiner* — Pho M Luu
(74) *Attorney, Agent, or Firm* — Pearne & Gordon LLP

(57) ABSTRACT

A magnetic memory device of MRAM type with a thermally-assisted writing procedure, the magnetic memory device being formed from a plurality of memory cells, each memory cell comprising a magnetic tunnel junction, the magnetic tunnel junction comprising a magnetic storage layer in which data can be written in a writing process; a reference layer, having a magnetization being always substantially in the same direction at any time of the writing process; an insulating layer between the reference layer and the storage layer; wherein the magnetic tunnel junction further comprises a writing layer made of a ferrimagnetic 3d-4f amorphous alloy, and comprising a net magnetization containing a first magnetization contribution originating from the sub-lattice of 3d transition elements and a second magnetization contribution originating from the sub-lattice of 4f rare-earth elements. The magnetic memory device has a low power consumption.

15 Claims, 7 Drawing Sheets

MAGNETIC MEMORY WITH A THERMALLY ASSISTED WRITING PROCEDURE

FIELD

The present invention relates to the field of magnetic memories, especially non-volatile random-access magnetic memories used to store and read data in electronic systems. More particularly, it relates to Magnetic Random Access Memories, referred to as MRAM, based on magnetic tunnel junctions and an improvement of the junction and writing process used in a tunnel junction based MRAM using a thermally assisted write scheme.

BACKGROUND

Magnetic memories MRAM have been the object of a renewed interest with the discovery of magnetic tunnel junctions (MTJ) having a strong magnetoresistance at ambient temperature. These magnetic random access memories present many advantages such as speed (a few nanoseconds of duration of writing and reading), non volatility, and insensitivity to ionizing radiations. Consequently, they are increasingly replacing memory that uses more conventional technology based on the charge state of a capacitor (DRAM, SRAM, FLASH).

In conventional MTJ based MRAM, the memory cell consists of an element having a junction consisting of a stack of several alternatively magnetic and non-magnetic metallic layers. Examples of conventional MTJ based MRAM devices are described in U.S. Pat. No. 5,640,343. In their simplest forms, junctions of MTJ based MRAM are made of two magnetic layers of different coercivity separated by an insulating thin layer where the first layer, the reference layer, is characterized by a fixed magnetization and the second layer, the storage layer, is characterized by a magnetization which direction can be changed. When the respective magnetizations of the reference layers and the storage layer are antiparallel, the resistance of the junction is high. On the other hand, when the respective magnetizations are parallel, the resistance becomes low.

Preferentially, the reference layer and the storage layer are made of 3d metals such as Fe, Co or Ni or their alloys. Eventually, boron can be added in the layer composition in order obtain an amorphous morphology and a flat interface. The insulating layer typically consists of alumina ($Al_2O_3$) or magnesium oxide (MgO). Preferentially, the reference layer can itself consist of several layers as described, for instance, in U.S. Pat. No. 5,583,725 in order to form a synthetic antiferromagnetic layer. A double tunnel junction as described in the paper by Y. Saito et al., Journal of Magnetism and Magnetic Materials Vol. 223 (2001), p. 293, can also be used. In this case, the storage layer is sandwiched between two thin insulating layers with two reference layers located on each opposite sides of the thin insulating layers.

FIG. 1 shows a memory cell 1 of a conventional MTJ based MRAM where a junction 2, comprising a storage layer 21, an insulating layer 22 and a reference layer 23, is placed between a selection CMOS transistor 3 and a word current line 4. A bit current line 5 is placed orthogonal with the word current line 4. When electrical currents flow in the word and bit current lines 4, 5, the word and bit magnetic fields 41 and 51 are respectively produced. Electrical currents are typically short current pulses from 2 to 5 nanoseconds having a magnitude on the order of 10 mA. An additional control current line 6 is intended to control the opening or the closing of the transistor 3 in order to address each memory cell individually.

During the writing process, the transistor 3 is in the blocked mode (OFF) and no current flows through the junction 2. The intensity of the current pulses and their synchronization are adjusted so that only the magnetization of the storage layer 21 located at the crossing of the two current lines can switch, under the combined effect of the word and bit magnetic fields 41 and 51.

During the reading process, the transistor 3 is in the saturated mode (ON) and a junction current will flows through the junction 2 allowing the measurement of the junction resistance of the memory cell 1. The state of the memory cell 1 is determined by comparing the measured resistance with the resistance of a reference memory cell. For example, a low junction resistance will be measured when the magnetization of the storage layer 21 is parallel to the magnetization of the reference layer 23 corresponding to a value of "0". Conversely, a magnetization of the storage layer 21, antiparallel to the magnetization of the reference layer 23, will yield a high junction resistance corresponding to a value of "1".

The basic structure of this type of conventional MTJ based MRAM is described in details in U.S. Pat. No. 4,949,039 and U.S. Pat. No. 5,159,513 while U.S. Pat. No. 5,343,422 is concerned with the implementation of a random-access memory (RAM) based on a MTJ based MRAM structure.

The type of writing mechanism described above has several disadvantages. In particular since the reversal of the magnetization of the storage layer 21 is produced under the effect of external fields and since the reversal fields are statistically distributed, it is possible to accidentally reverse certain neighboring junctions simply by the effect of the magnetic field produced along a lower or upper word or bit current line 4, 5. For high density memories with memory cells having submicronic dimensions, the number of addressing errors may be high. The reduction in the memory cells size will lead to an increase in the value of the individual reversal field and require a higher current to write memory cells, increasing the circuit consumption. Consequently, the writing mode using two current lines limits the integration density.

An improvement with respect to the above MTJ based MRAM structure is the thermally assisted writing process described in US2005002228 and represented in FIG. 2. The particularity of the junction 2 of such thermally assisted MRAM is that both the reference layer 23 and the storage layer 21 are exchange biased. More precisely, the reference and storage layers 23, 21 are pinned by interaction with an adjacent antiferromagnetic reference layer 24 and antiferromagnetic storage layer 21b respectively, where the blocking temperature $T_{BS}$ of the antiferromagnetic storage layer 21b is smaller than the blocking temperature $T_{BR}$ of the antiferromagnetic reference layer 24.

During the thermally-assisted writing process, a junction current pulse 31 having a magnitude comprised between $10^5$ $A/cm^2$ and $10^7$ $A/cm^2$ and lasting several nanoseconds is sent through a connecting current line 7 and the junction 2 (with transistor ON), rising the temperature of the junction to about 120 to 200° C., lying between $T_{BS}$ and $T_{BR}$ where the magnetic coupling between the ferromagnetic storage layer 21 and antiferromagnetic storage layer 21b disappears. The junction 2 is then cooled while a moderate word magnetic field 41 is applied by flowing a current in the word current line 4, allowing for the reversal of the magnetization of the storage layer 21.

The reading process is performed by making a measurement current flow through the junction (with the transistor ON) in order to measure the junction resistance and deduces the orientation of the magnetization of the storage layer from said resistance value. The measurement current is lower than the one used during the writing process resulting in less heating of the junction.

A similar MTJ based MRAM structure with the thermally assisted writing process is disclosed in US2005180202. Here a magnetic element comprises a ferromagnetic free layer, a ferromagnetic pinned layer, and a spacer layer 120 between the free layer and the pinned layer. The magnetic element further comprises a heat assisted switching layer exchange coupling the free layer 130 and pins the magnetization of the free layer 130 at temperatures below a blocking temperature of about 150° C.

In contrast with the conventional MTJ based MRAM, the thermally assisted MTJ based MRAM structure described above is characterized by a considerably improved thermal stability of the storage layer 21 due to the pinning of the antiferromagnetic storage layer 21b. An improved writing selectivity is also achieved due to the selective heating of the memory cell to be written in comparison with the neighboring memory cells remaining at ambient temperature. The thermally assisted MTJ based MRAM structure also allows for a better stability in a zero magnetic field (retention) by using materials with high magnetic anisotropy at ambient temperature; a higher integration density without affecting its stability limit; and reduced power consumption during the writing process since the power required to heat the memory cell 1 is less than the one needed to generate magnetization in the conventional MTJ based MRAM structure.

However, with the thermally assisted MTJ based MRAM described above, the current to be supplied in order to generate a magnetic field that is suitable for switching the storage layer magnetization, i.e., in the order of 30-50 Oe, is in the mA range. This current is still too large for low power consumption applications and will also increase continuously as the cell size is reduced.

Alternative thermally assisted MTJ based MRAM structures avoiding the use of current word and bit lines by using a spin polarized current for the switching of the magnetization of the storage layer have been proposed in US-A-20050104101, U.S. Pat. No. 6,603,677 B2 and U.S. Pat. No. 6,532,164 B2. The solutions proposed however are still not suitable for low-power applications and cannot guarantee the stability of the information for long time while preserving a reasonable low aspect ratio of the memory cell.

SUMMARY

The present application discloses a magnetic memory device of MRAM type with a thermally-assisted writing procedure which overcome at least some limitations of the prior art and with low power consumption.

According to the embodiments, a magnetic memory device of MRAM type with a thermally-assisted writing procedure, the magnetic memory device being formed from a plurality of memory cells, each memory cell comprising a magnetic tunnel junction, the magnetic tunnel junction comprising a magnetic storage layer in which data can be written in a writing process; a reference layer, having a magnetization being always substantially in the same direction at any time of the writing process; an insulating layer between the reference layer and the storage layer; wherein the magnetic tunnel junction further comprises a writing layer made of a ferrimagnetic 3d-4f amorphous alloy, and comprising a net magnetization containing a first magnetization contribution originating from the sub-lattice of 3d transition elements and a second magnetization contribution originating from the sub-lattice of 4f rare-earth elements.

In an embodiment, the net magnetization of the writing layer is dominated by the second magnetization contribution at a temperature below a compensation temperature $T_{COMP}$ of the writing layer, and dominated by the first magnetization contribution at a temperature above $T_{COMP}$.

In an embodiment, the writing layer can be located on top of the storage layer and/or can have a thickness of 10 to 100 ns.

In another embodiment, the magnetic tunnel junction can further comprise a non-magnetic spacer layer between the writing layer and the storage layer.

In yet another embodiment, the storage layer can comprise a ferromagnetic storage layer and an antiferromagnetic storage layer. The ferromagnetic storage layer can be made of a ferromagnetic material selected from the group comprising Permalloy (Ni80Fe20), Co90Fe10 or other magnetic alloys containing Fe, Co or Ni and can have a thickness of the order 1 to 10 nm.

In yet another embodiment, the antiferromagnetic storage layer is made of a manganese-based alloy such as IrMn or FeMn. The antiferromagnetic storage layer can further have a moderate blocking temperature $T_{BS}$ from 120 to 220° C.

In yet another embodiment, the reference layer comprises a first ferromagnetic reference layer and a second ferromagnetic reference layer antiferromagnetically exchange-coupled by inserting between them a non-ferromagnetic reference layer. The ferromagnetic reference layers can be made of a Fe, Co or Ni based alloy. The antiferromagnetic reference layer can have a blocking temperature $T_{BR}$ higher than $T_{BS}$.

In yet another embodiment, one of the ferromagnetic reference layers can be pinned by an antiferromagnetic reference layer. The antiferromagnetic reference layer can be made of manganese-based alloy such as PtMn or NiMn.

In yet another embodiment, the insulating layer is made of a material selected from the group comprising Al2O3 or MgO.

In yet another embodiment, a thermal barrier layer is added at the top and at the bottom of the junction. The thermal barrier can be made of BiTe or GeSbTe.

In yet another embodiment, each junction of each memory cell of the magnetic memory device is connected on the side of the writing layer to a connecting current line and on the opposite side to a control current line placed perpendicular with the connecting current line.

The present disclosure also pertains to a writing process performed by combining the heating of the junction using a junction current pulse, with the magnetostatic field generated by the net magnetization of the writing layer in order to reverse the magnetization of the storage layer. Here, heating the junction allows the decrease in the reversal field of the ferromagnetic storage layer.

In an embodiment, the method comprises:

orienting the net magnetization of the writing layer substantially antiparallel to the magnetization of the ferromagnetic storage layer;

reversing the magnetization of the first magnetization contribution of the writing layer;

reversing the magnetization of the second magnetization contribution of the writing layer; and reversing the magnetization of the ferromagnetic storage layer.

The thermally-assisted MTJ based MRAM of the invention avoids the use of the word and bit current lines and consequently, has significantly lower power consumption and can be more easily scaled down in comparison with conventional and thermally-assisted MTJ based MRAM of the prior art. In addition, since the proposed writing process is independent of switching fields range as it is the case when word and bit current lines are used, addressing errors are reduced and more reliable data writing is obtained.

In contrast with the writing process using a spin polarized current in thermally-assisted MTJ based MRAM, the use of the magnetostatic field generated by the magnetization of the writing layer in the writing process of the invention yields better power consumption performances due to lower current density involved and a better thermal stability of the junction due to exchange-coupling of the storage layer with the antiferromagnetic storage layer.

BRIEF DESCRIPTION OF THE DRAWINGS

The preferred embodiments will be better understood with the aid of the description of an embodiment given by way of example and illustrated by the figures, in which.

DETAILED DESCRIPTION OF THE PREFERRED EMBODIMENTS

Figure 1:
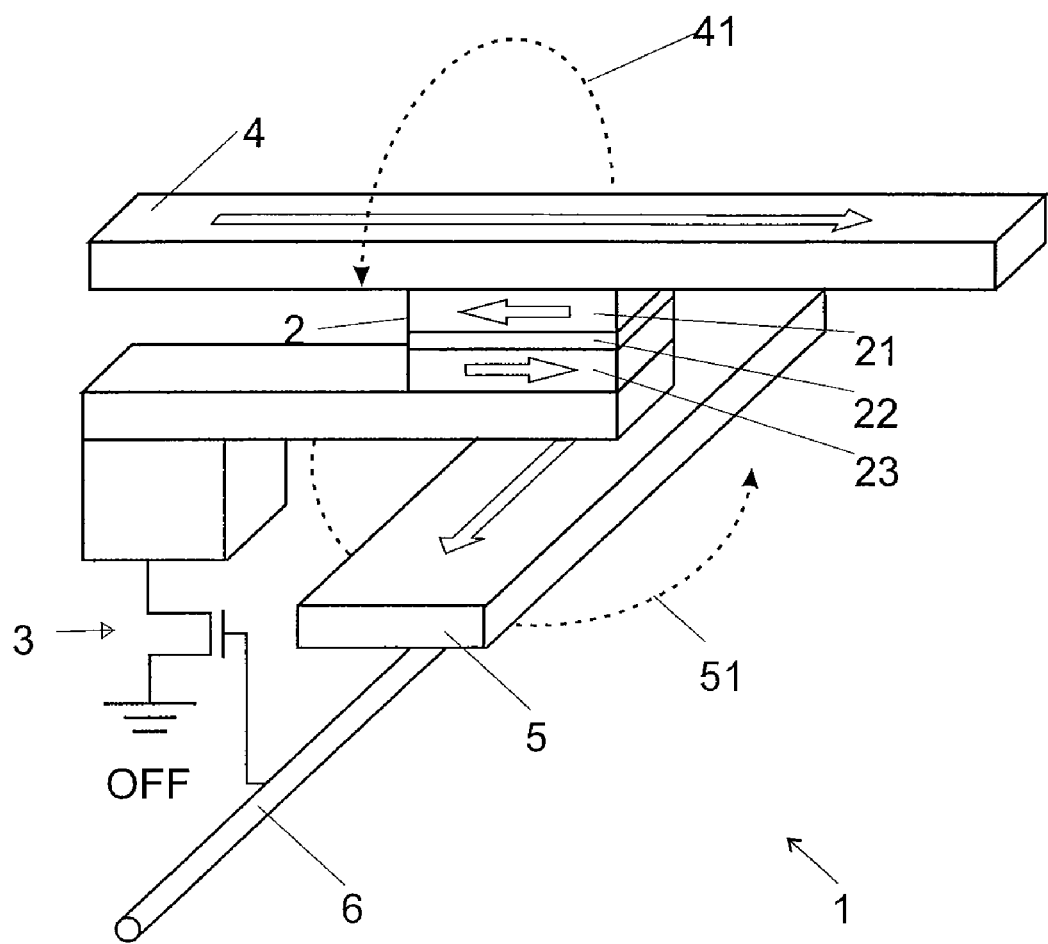
FIG. 1 shows a schematic view of a magnetic tunnel junction memory cell according to the prior art.
Figure 2:
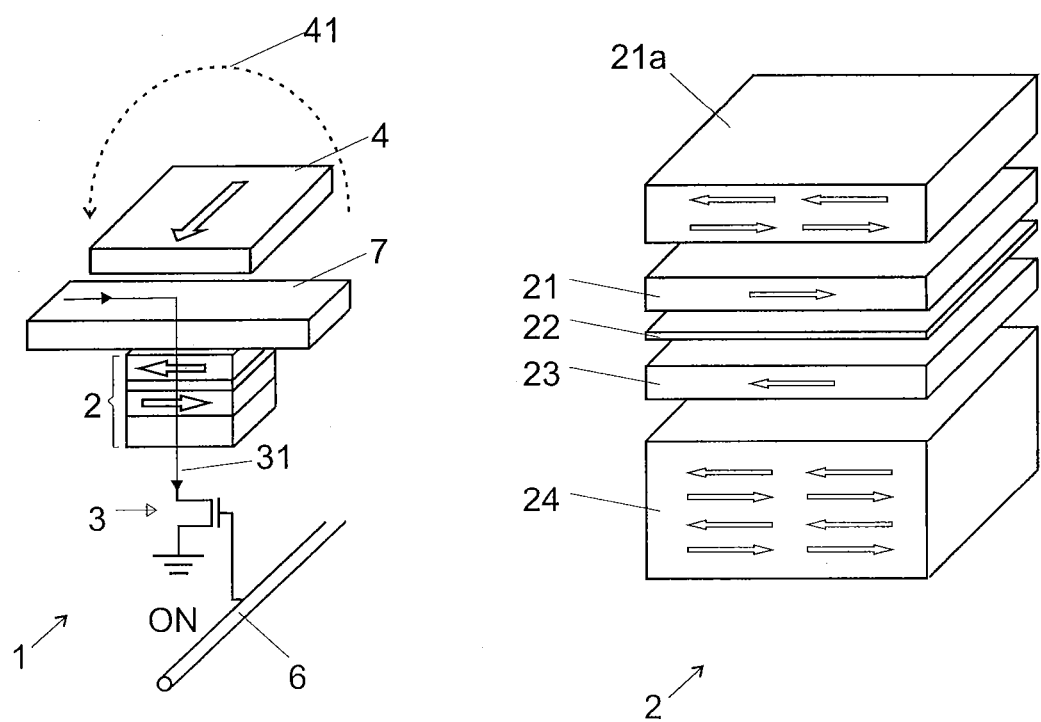
FIG. 2 represents a memory cell and the corresponding junction of a thermally assisted MRAM according to the prior art.
Figure 3:
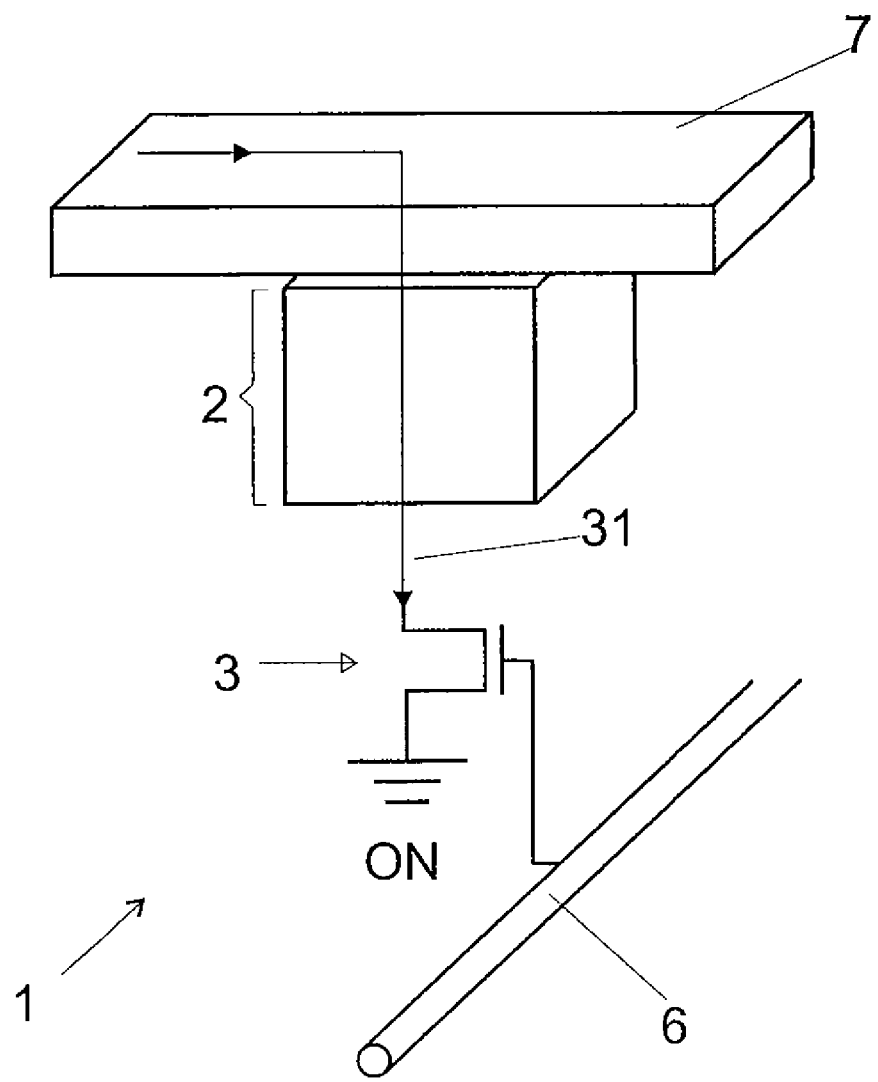
FIG. 3 illustrates schematically a memory cell according to an embodiment.

A memory cell 1 of the present invention is represented in FIG. 3 where a junction 2 is placed between a selection CMOS transistor 3 and a connecting current line 7 for passing a junction current pulse 31 flowing through the junction 2 when the transistor 3 is ON. A control current line 6 is used to control the opening and the closing of the transistor 3 in order to address each memory cell individually.

Figure 4:
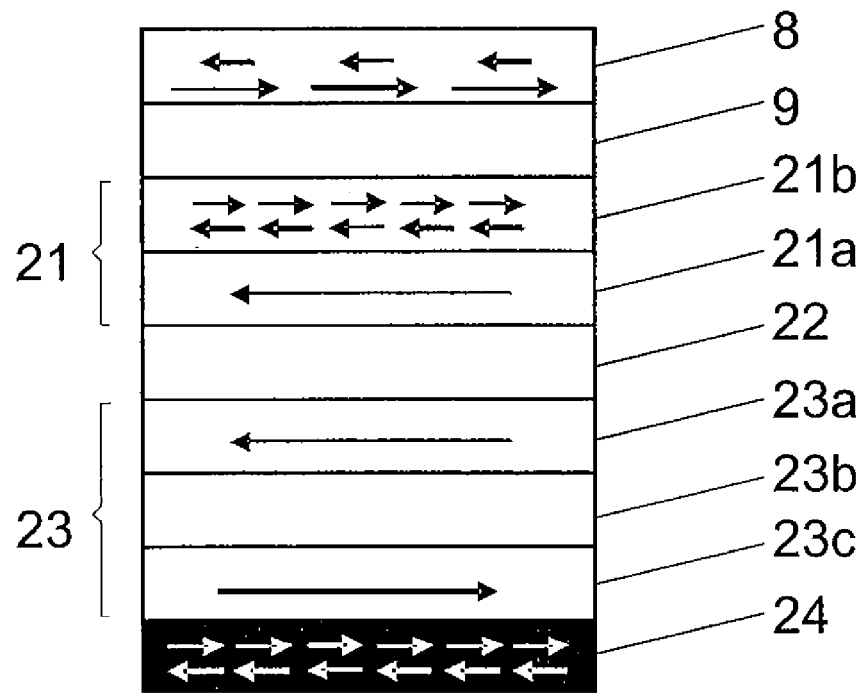
FIG. 4 illustrates schematically a junction according to an embodiment.

A close view on the junction 2 of the present invention is given in FIG. 4. The junction contains a storage layer 21 preferably comprising a ferromagnetic storage layer 21a and an antiferromagnetic storage layer 21b. The ferromagnetic storage layer 21a has a thickness of the order of 1 to 10 nm and is made of a material having a planar magnetization, typically selected from the group Permalloy ($Ni_{80}Fe_{20}$), $Co_{90}Fe_{10}$ or other alloys containing Fe, Co or Ni. The ferromagnetic storage layer 21a is exchange-coupled by the antiferromagnetic storage layer 21b made of a manganese-based alloy, for example, of IrMn or FeMn. The antiferromagnetic storage layer 21b has a blocking temperature $T_{BS}$ sufficiently high to ensure that at standby temperature, i.e., in the absence of heating, magnetization of the ferromagnetic storage layer 21a is sufficiently pinned to be able to preserve its magnetization over a period of several years but not so high as to make it necessary to heat the junction excessively during every the writing process that could yield to material degradation and high power consumption. Here, a $T_{BS}$ in the range of, for example, 120 to 220° C. is suitable.

The junction 2 also contains a reference layer 23 preferably comprising a first ferromagnetic reference layer 23a and a second ferromagnetic reference layer 23c, both formed of a Fe, Co or Ni based alloy. The two ferromagnetic reference layers 23a, 23c are antiferromagnetically coupled by inserting between them a non-ferromagnetic reference layer 23b made, for example, of ruthenium. An antiferromagnetic reference layer 24, preferably formed of a Mn based alloy such as PtMn or NiMn and characterized by a blocking temperature $T_{BR}$ higher than $T_{BS}$, is provided below the second ferromagnetic reference layer 23c. The antiferromagnetic reference layer 24 orients the magnetic moment of the first ferromagnetic reference layer 23a, and a pinning field is generated that fixes the magnetic moment of the second ferromagnetic reference layer 23c. The reference layer structure described above is well known in the state of the art under the name of synthetic antiferromagnet pinned layer.

An insulating layer 22 playing the role of a tunnel barrier and preferably made of a material selected from the group comprising $Al_2O_3$ and MgO is inserted between the storage layer 21 and the reference layer 23. The tunneling resistance of a junction depends exponentially on the insulating layer thickness and is measured by the resistance-area product (RA) of the junction. The RA must sufficiently small in order to flow a current through the junction which is sufficiently high to raise the temperature of the antiferromagnetic storage layer 21b above its blocking temperature $T_{BS}$. In order to force a current density in the range of $10^5$ A/cm$^2$ to $10^7$ A/cm$^2$, typically required to raise the temperature of the junction up to 100° C., the RA value should be of the order of 1 to 500Ω·µm$^2$.

According to the present invention, a writing layer 8 is inserted to the junction 2, on top of the storage layer 21 and can be separated from it by a non-magnetic spacer layer 9. The writing layer 8 is preferentially made of a ferrimagnetic 3d-4f amorphous alloy by choosing the adequate elements and relative compositions between a 3d transition metal and a 4f rare-earth material. Such ferrimagnetic layers used in MRAM devices are described in documents U.S. Pat. No. 6,385,082 B1, US-A1-2005040433 and U.S. Pat. No. 7,129, 555 B2 for purposes different that the ones of the present invention.

Figure 5:
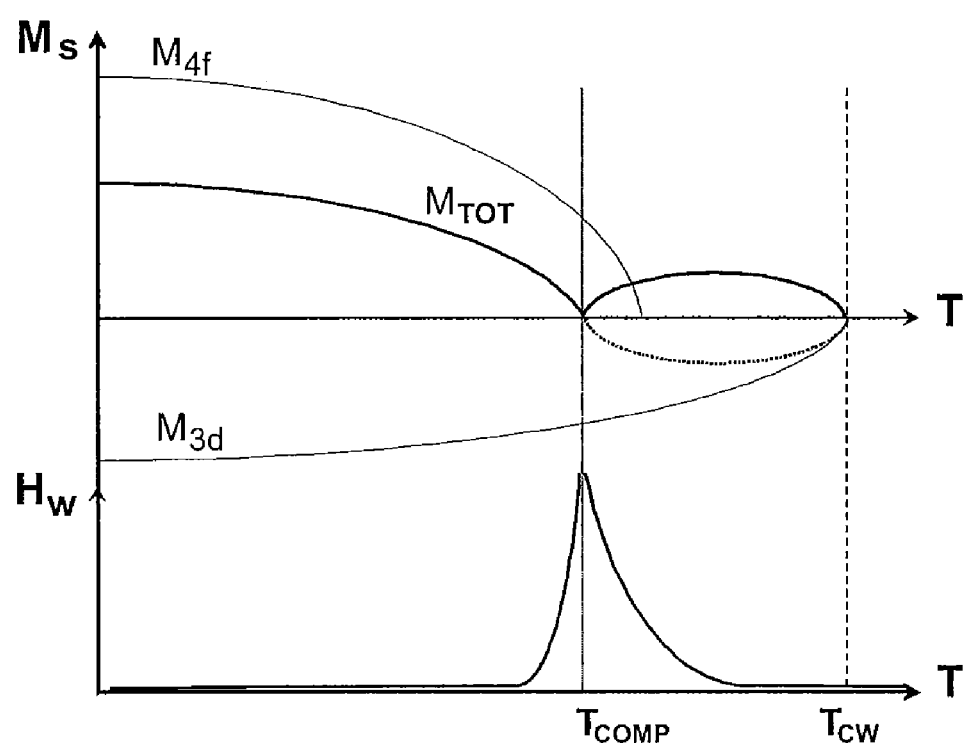
FIG. 5 shows the thermal dependence of the saturation magnetization and of the coercive field $H_W$ for the ferrimagnetic writing layer according to an embodiment.

The net magnetization of the writing layer 8 can be decomposed in a first contribution originating from the sub-lattice of 3d transition metals atoms and a second contribution originating from the sub-lattice of 4f rare-earth atoms. The net magnetization corresponds to the vectorial sum of the two sub-lattice magnetization contributions. FIG. 5 shows the thermal dependence of the absolute values of saturation magnetization $M_{3d}$ for the 3d contribution and $M_{4f}$ for the 4f contribution as well as the net magnetization $M_{TOT}$ of the writing layer 8. The corresponding coercive field $H_W$ is also shown. When the writing layer (8) is at the compensation temperature $T_{COMP}$, both magnetization contributions $M_{4f}$ and $M_{3d}$ are equal and the total saturation magnetization $M_{TOT}$ is null, corresponding to both 3d and 4f sub-lattices being oriented antiparallel. This corresponds to a coercive field $H_W$ increasing theoretically to infinite. As FIG. 5 shows, the net magnetization direction is dominated by the 4f contribution at temperatures below $T_{COMP}$, and, conversely, is dominated by the 3d metal contribution at temperatures above $T_{COMP}$. As the temperature is increased at or above the Curie temperature $T_{CW}$ of the writing layer 8, thermal fluctuations are such that the net magnetization becomes zero and the material is purely paramagnetic.

Figure 6:
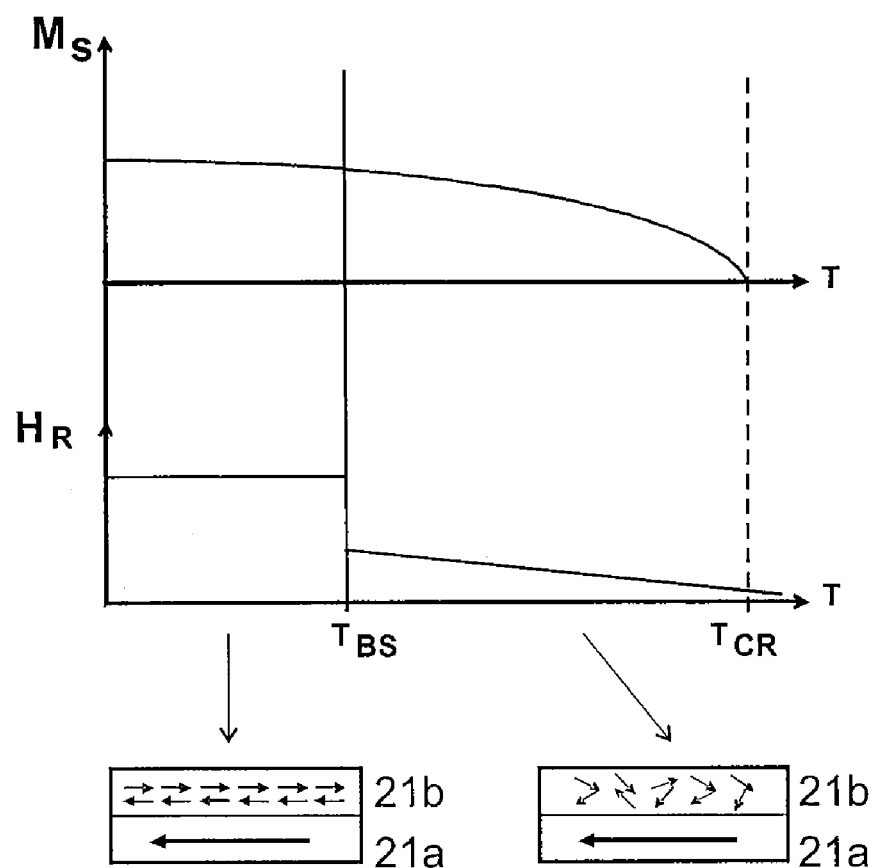
FIG. 6 shows the thermal dependence of the saturation magnetization $M_S$ and of the reversal field $H_R$ for an exchange-coupled ferromagnetic storage layer.

The thermal dependence of the saturation magnetization $M_S$ and of the reversal field $H_R$ of the exchange-coupled ferromagnetic storage layer 21a is represented in FIG. 6. At temperatures equal or greater than the blocking temperature $T_{BS}$ of the antiferromagnetic storage layer 21b, the exchange coupling of the ferromagnetic storage layer 21a with the antiferromagnetic storage layer 21b disappears resulting in a smaller reversal field $H_R$. The corresponding magnetization of the ferromagnetic storage layer 21a and the antiferromagnetic storage layer 21b is shown schematically on the figure.

According to the present invention, the writing process is achieved by combining the heating of the junction 2 using a current pulse having a magnitude of the order of $10^5$ A/cm$^2$ to $10^7$ A/cm$^2$ and lasting less than 100 ns, and reversing the magnetization of the storage layer 21 through the magnetostatic interaction occurring between the net magnetization $M_{TOT}$ of the writing layer 8 and the ferromagnetic storage layer 21a. The reversal of the exchange coupling direction of the antiferromagnetic storage layer 21b is facilitated at a junction temperature above $T_{BS}$ where the exchange coupling of the ferromagnetic storage layer 21a with the antiferromagnetic storage layer 21b disappears and the reversal field $H_R$ of the is ferromagnetic storage layer 21a become smaller as discussed above. The reversal of the magnetization of the antiferromagnetic storage layer 21b can be further facilitated by placing the writing layer 8 in the vicinity of the ferromagnetic storage layer 21a in order to increase the magnetostatic interaction.

In one embodiment of the invention, the thickness and composition of the writing layer 8 are optimized in order to obtain a writing layer 8 having a high stability in temperature and generating a large magnetostatic field when cycled in temperature. Here, for example, the writing layer 8 is 10 to 100 nm in thickness and is composed of an alloy containing Co or Fe with Gd, Sm, or Tb such as, for example, GdCo, SmCo or TbFeCo.

Figure 7:
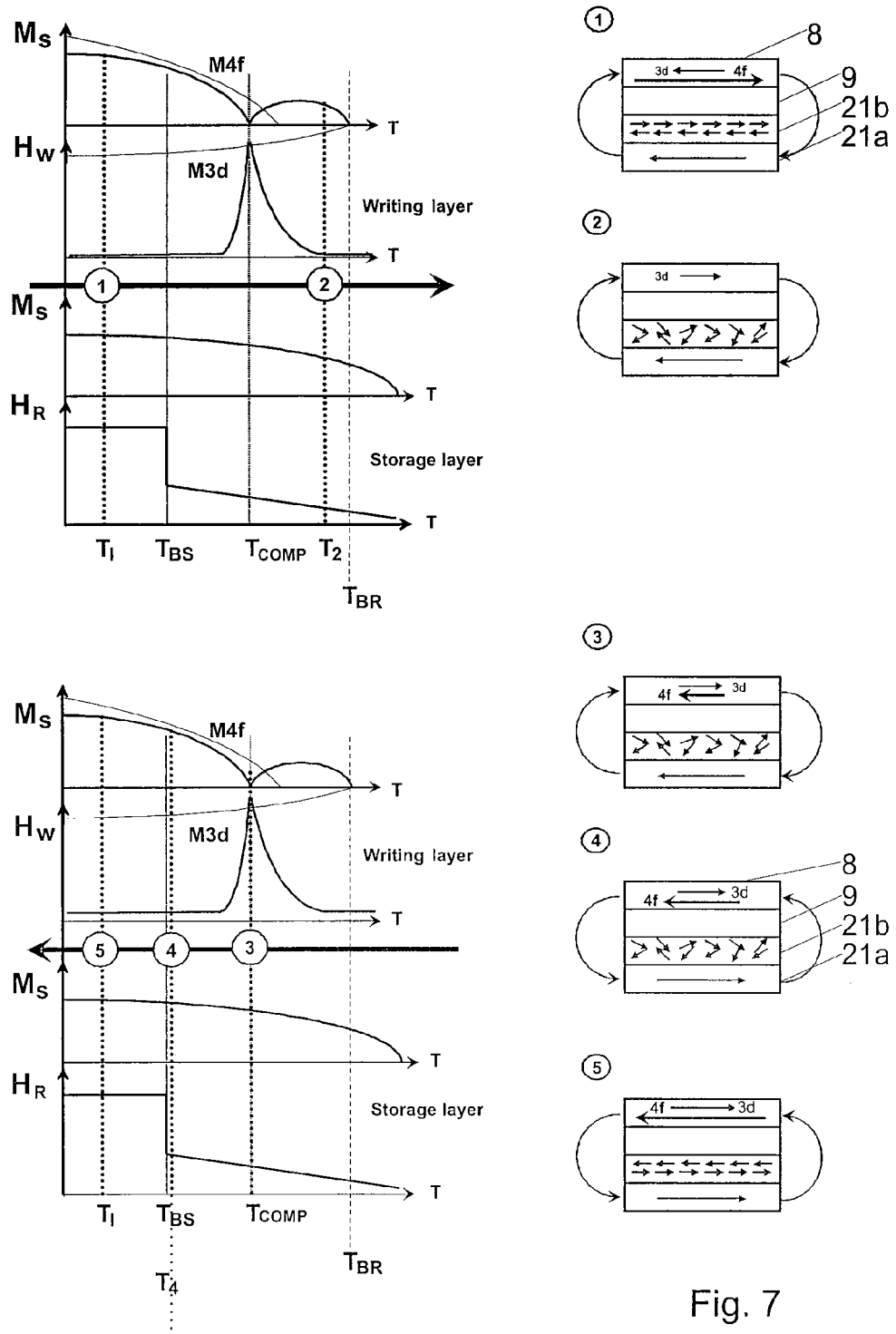
FIG. 7 Shows a complete writing procedure cycle of the thermally assisted MTJ based MRAM of an embodiment.

A complete writing process cycle of the thermally assisted MTJ based MRAM of the present invention is represented schematically in FIG. 7. More particularly, the figure shows the thermal dependence of the saturation magnetization $M_S$ and of the coercive field $H_W$ and reversal field $H_R$ of the writing layer 8 and storage layer 21 respectively. The corresponding magnetization states of the writing layer 8 and storage layer 21 are also illustrated schematically on the right hand side of FIG. 7, where the curved arrows represent the magnetostatic interaction field occurring between the writing layer 8 and the ferromagnetic storage layer 21a.

The different writing process steps are described below. The different steps are identified in the figure by the circled numeral. In the present example, $T_{COMP}$ of the writing layer 8 is higher than the blocking temperature $T_{BS}$ of the antiferromagnetic storage layer 21b.

Step 1, initial step—In the initial state, no current flows through the junction and the junction is at standby temperature $T_1$. At this temperature well below $T_{BS}$, the net magnetization of the writing layer 8 is dominated by the orientation of the 4f contribution and is oriented substantially antiparallel with respect to the magnetization of the antiferromagnetic storage layer 21b due to magnetostatic interactions.

Step 2, reversal of the writing layer 3d magnetization—A junction current pulse 31 is sent through the junction 2 in order to heat the junction 2 to a temperature $T_2$ lying above $T_{BS}$ of the antiferromagnetic storage layer 21b and $T_{COMP}$ of the writing layer 8, but below the Curie temperature of the two respective layers. At $T_2$, the net magnetization of the writing layer 8 corresponds to the sole 3d contribution that has its magnetization direction reversed by about 180° compared to its direction the initial step in order to become substantially antiparallel with the magnetization of the ferromagnetic layer 21a.

Step 3, reversal of the writing layer 4f magnetization—When the junction 2 temperature is decreased at a temperature $T_3$, lower than $T_{COMP}$ of the writing layer 8 but higher than $T_{BS}$, the 4f contribution of the writing layer magnetization reappears in a substantially reversed direction compared to the initial step in order to be substantially antiparallel with the 3d contribution. At $T_3$, the 3d and 4f magnetization contributions are rotated by about 180° in respect to their orientations in the initial step.

Step 4, reversal of the ferromagnetic storage layer magnetization—As the temperature is decreased to $T_4$, slightly above $T_{BS}$, the 4f magnetization contribution of the writing layer 8 becomes large enough to induce magnetostatic interactions, able to reverse the magnetization of the ferromagnetic storage layer 21a in a direction substantially antiparallel in respect to the net magnetization of the writing layer 8.

Step 5, final step—By further decreasing the temperature to $T_5$, below $T_{BS}$, the magnetization of the ferromagnetic layer 21a becomes frozen in the substantially antiparallel reversed direction of step 4. In this final step, the magnetization of the ferromagnetic storage layer 21a and the net magnetization of the writing layer 8 are rotated by about 180° in respect to their respective orientations in the initial step.

As can be seen from the writing process steps described above, the direction of the ferromagnetic storage layer 21a magnetization will be reversed for each complete writing cycle (from the initial step to final step), independent of the initial magnetization direction of the ferromagnetic storage layer 21a. Consequently, a "read before write" step is required prior to each writing cycle in order to sense the initial state of the memory cell and deduce its logic state.

It is understood that the present invention is not limited to the exemplary embodiments described above and other examples of implementations are also possible within the scope of the patent claims.

For example, in another embodiment of the invention, at least one thermal barrier layer (not shown) made typically of BiTe or GeSbTe and having a very low thermal conductivity can be added at the top and at the bottom of the junction 2. The purpose of these additional layers is to increase the heating efficiency of the current flowing through the junction while limiting the diffusion of the heat towards the electrode (not shown) ensuring the electrical connection between the junction 2 and the connecting current line 7. Here, the thermal barrier itself is electrically connected to the electrode directly or via a conductive layer, for example made of TiN or TiWN.

A magnetic memory device (not represented) can be formed by assembling a matrix comprising a plurality of memory cells 1 of the invention, where each junction 2 of each memory cell 1 is connected on the side of the writing layer 8 to a connecting current line 7 and on the opposite side to the control current line 6 placed perpendicular with the connecting current line 7. When one of the memory cells 1 is to be written, a current pulse is sent in one or several control lines 6 in order to put at least one of the transistors 3 of the corresponding control lines 6 in mode ON, and a junction current pulse 31 is sent to each connecting lines 7 corresponding to the memory cells to be written, i.e., the memory cells placed at the intersection of the active connecting current lines 7 and active control lines 6.

REFERENCE NUMBERS

1 Memory cell
2 Junction
21 Storage layer
21a ferromagnetic storage layer 21b antiferromagnetic storage layer
22 Insulating layer
23 Reference layer
23a First ferromagnetic reference layer
23b Non-ferromagnetic reference layer
23c Second ferromagnetic reference layer
24 Antiferromagnetic reference layer
3 Transistor
31 Junction current pulse
4 Word current line
41 Word magnetic field
5 Bit current line
51 Bit magnetic field
6 Control current line
7 Connecting current line
8 Writing layer
9 Non-magnetic spacer layer

REFERENCE SYMBOLS $H_R$ Reversal field of the ferromagnetic storage layer
$H_W$ Coercive field of the writing layer
$M_{3d}$ Magnetization contribution of the 3d sub-lattice
$M_{4f}$ Magnetization contribution of the 4f sub-lattice
$M_S$ Saturation magnetization
$M_{TOT}$ Net magnetization
$T_{BS}$ Blocking temperature of the antiferromagnetic storage layer
$T_{BR}$ Blocking temperature of the antiferromagnetic reference layer
$T_{COMP}$ Compensation temperature
$T_{CS}$ Curie temperature of the antiferromagnetic storage layer
$T_{CW}$ Curie temperature of the writing layer
$T_1$ Temperature at step 1 (standby temperature)
$T_2$ Temperature at step 2
$T_3$ Temperature at step 3
$T_4$ Temperature at step 4
$T_5$ Temperature at step 5

The invention claimed is:

1. A magnetic memory device of MRAM type with a thermally-assisted writing procedure, the magnetic memory device being formed from
a plurality of memory cells, each memory cell comprising:
a magnetic tunnel junction formed from
a magnetic storage layer in which data can be written in a writing process;
a reference layer, having a magnetization being always substantially in the same direction at any time of the writing process;
an insulating layer between the reference layer and the storage layer;
wherein the magnetic tunnel junction further comprises:
a writing layer made of a ferrimagnetic 3d-4f amorphous alloy and comprising:
a net magnetization containing a first magnetization contribution originating from the sub-lattice of 3d transition elements; and
a second magnetization contribution originating from the sub-lattice of 4f rare-earth elements;
wherein the net magnetization of the writing layer is dominated by the second magnetization contribution at a temperature below a compensation temperature $T_{COMP}$ of the writing layer, and dominated by the first magnetization contribution at a temperature above $T_{COMP}$.

2. A magnetic memory device according to claim 1, wherein the writing layer is made of an alloy containing Co or Fe with Gd, Sm, or Tb.

3. A magnetic memory device according to claim 1, wherein the writing layer is composed of GdCo, SmCo or TbFeCo.

4. A magnetic memory device according to claim 1, wherein the magnetic tunnel junction further comprises a non-magnetic spacer layer between the writing layer and the storage layer.

5. A magnetic memory according to claim 1, wherein the storage layer comprises a ferromagnetic storage layer and an antiferromagnetic storage layer, the antiferromagnetic storage layer having a blocking temperature $T_{BS}$.

6. A magnetic memory according to claim 5, wherein the blocking temperature $T_{BS}$ is in a range comprised between 120° C. and 220° C.

7. A magnetic memory device according to claim 5, wherein the reference layer comprises an antiferromagnetic reference layer having a blocking temperature $T_{BR}$ higher than $T_{BS}$.

8. A magnetic memory device according to claim 7, wherein the compensation temperature $T_{COMP}$ of the writing layer is higher than the blocking temperature $T_{BS}$ of the antiferromagnetic storage layer and lower than the blocking temperature $T_{BR}$ of the antiferromagnetic reference layer.

9. A method for writing a magnetic memory device comprising a plurality of memory cells,
each memory cell comprising a magnetic tunnel junction formed from
a magnetic storage layer containing a ferromagnetic storage layer having a magnetization that can be reversed during the writing process,
a reference layer having a magnetization being always substantially in the same direction during the writing process, and
an insulating layer between the reference layer and the storage layer;
the magnetic tunnel junction further comprising
a writing layer made of a ferrimagnetic 3d-4f amorphous alloy comprising a net magnetization containing a first magnetization contribution originating from the sub-lattice of 3d transition elements and
a second magnetization contribution originating from the sub-lattice of 4f rare-earth elements;
the method comprising:
orienting the net magnetization of the writing layer substantially antiparallel to the magnetization of the ferromagnetic storage layer;
reversing the magnetization of the first magnetization contribution of the writing layer substantially antiparallel with the magnetization of the ferromagnetic layer;
reversing the magnetization of the second magnetization contribution of the writing layer substantially antiparallel with the first magnetization contribution; and
reversing the magnetization of the ferromagnetic storage layer substantially antiparallel in respect to the net magnetization of the writing layer.

10. A method according to claim 9, wherein the antiferromagnetic storage layer has a blocking temperature $T_{BS}$, and wherein orienting the net magnetization of the writing layer is performed with the magnetic tunnel junction being at a temperature $T_1$ below $T_{BS}$.

11. A method according to claim 10,
wherein the net magnetization being dominated by the first and second magnetization contribution at a temperature respectively above and below a compensation temperature $T_{COMP}$ of the writing layer, and
wherein reversing the magnetization of the first magnetization contribution is performed with the magnetic tunnel junction being heated at a temperature $T_2$, above $T_{BS}$ and $T_{COMP}$, but below the Curie temperature of the writing and antiferromagnetic storage layers.

12. A method according to claim 11, wherein reversing the magnetization of the second magnetization contribution is performed with the magnetic tunnel junction being at a temperature $T_3$, lower than $T_{COMP}$ but higher than $T_{BS}$.

13. A method according to claim 11, wherein the magnetic tunnel junction being heated at the temperature $T_2$ by passing a junction current pulse through the junction.

14. A method according to claim 10, wherein reversing the magnetization of the ferromagnetic storage layer is performed at a temperature $T_5$ below $T_{BS}$ where the magnetization of the ferromagnetic layer becomes frozen.

15. A method for writing a magnetic memory device comprising
a plurality of memory cells, each memory cell comprising
a magnetic tunnel junction formed from a magnetic storage layer containing a ferromagnetic storage layer having a magnetization that can be reversed during the writing process,
a reference layer having a magnetization being always substantially in the same direction during the writing process, and
an insulating layer between the reference layer and the storage layer;
the magnetic tunnel junction further comprising
a writing layer made of a ferrimagnetic 3d-4f amorphous alloy comprising a net magnetization containing a first magnetization contribution originating from the sub-lattice of 3d transition elements and
a second magnetization contribution originating from the sub-lattice of 4f rare-earth elements;
the method comprising:
an initial step where the net magnetization of the writing layer is oriented antiparallel in respect to the magnetization of the ferromagnetic storage layer due to magnetostatic interactions between the two layers;
a second step where the magnetization of the first magnetization contribution of the writing layer is reversed by 180° compared to its orientation in the initial step;
a third step where the magnetization of the second magnetization contribution of the writing layer is reversed by 180° compared to its direction in the initial state;
a fourth step where the magnetization of the ferromagnetic storage layer is reversed by 180° compared to its direction in the initial state due to magnetostatic interactions between the ferromagnetic storage layer and the writing layer;
a final step where the magnetization of the ferromagnetic storage layer and the net magnetization of the writing layer is reversed by 180° in respect to their respective orientations in the initial step.

* * * * *